US009934855B2

(12) United States Patent
Asnaashari et al.

(10) Patent No.: US 9,934,855 B2
(45) Date of Patent: Apr. 3, 2018

(54) NODE RETAINER CIRCUIT INCORPORATING RRAM

(71) Applicant: Crossbar, Inc., Santa Clara, CA (US)

(72) Inventors: Mehdi Asnaashari, Danville, CA (US); Hagop Nazarian, San Jose, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 15/013,123

(22) Filed: Feb. 2, 2016

(65) Prior Publication Data

US 2016/0225442 A1    Aug. 4, 2016

Related U.S. Application Data

(60) Provisional application No. 62/111,632, filed on Feb. 3, 2015.

(51) Int. Cl.
*G11C 11/00* (2006.01)
*G11C 13/00* (2006.01)
*G11C 14/00* (2006.01)

(52) U.S. Cl.
CPC ........ *G11C 13/0069* (2013.01); *G11C 13/004* (2013.01); *G11C 14/009* (2013.01)

(58) Field of Classification Search
CPC ........ G06F 2212/7207; G11C 13/0069; G11C 13/004; G11C 14/009

(Continued)

(56) References Cited

U.S. PATENT DOCUMENTS 7,236,388 B2 *  6/2007  Hosoi ............... G11C 13/0007
                                              365/107
7,372,723 B1 *  5/2008  Lu .................... G11C 11/005
                                              365/158

(Continued)

OTHER PUBLICATIONS

Onkaraiah, et al., "Bipolar ReRAM Based Non-Volatile Flip-flops for Low-Power Architectures", New Circuits and Systems Conference (NEWCAS), 2012, pp. 417-420, IEEE, 4 pages.

(Continued)

*Primary Examiner* — Anthan Tran
(74) *Attorney, Agent, or Firm* — Amin, Turocy & Watson, LLP

(57) ABSTRACT

A retainer node circuit is provided that can retain state information of a volatile circuit element (e.g., a flip-flop, latch, switch, register, etc.) of an electronic device for planned or unplanned power-down events. The retainer node circuit can include a resistive-switching memory cell that is nonvolatile, having very fast read and write performance. Coupled with power management circuitry, the retainer node circuit can be activated to receive and store a signal (e.g., bit) output by the volatile circuit element, and activated to output the stored signal. Various embodiments disclose non-volatile retention of state information for planned shut-down events as well as unplanned shut-down events. With read and write speeds in the tens of nanoseconds, sleep mode can be provided for volatile circuit elements between clock cycles of longer time-frame applications, enabling intermittent power-down events between active periods. This enables reduction in power without loss of activity for an electronic device.

18 Claims, 13 Drawing Sheets

(58) Field of Classification Search
USPC .......................................................... 365/228
See application file for complete search history.

(56) References Cited

U.S. PATENT DOCUMENTS

| | | | | |
|---|---|---|---|---|
| 9,036,406 B2* | 5/2015 | Kim | ................... | G11C 11/1675 |
| | | | | 365/130 |
| 2006/0033543 A1 | 2/2006 | Lu | | |
| 2008/0090337 A1* | 4/2008 | Williams | ........... | G11C 13/0009 |
| | | | | 438/133 |
| 2010/0001774 A1* | 1/2010 | Djaja | .................... | H03K 3/012 |
| | | | | 327/202 |
| 2013/0069964 A1* | 3/2013 | Wuu | ................. | G11C 13/0004 |
| | | | | 345/530 |
| 2014/0268997 A1 | 9/2014 | Nazarian et al. | | |
| 2015/0179256 A1 | 6/2015 | Kitagawa et al. | | |

OTHER PUBLICATIONS

Mahmoodi-Meimand, et al., "Data-Retention Flip-Flops for Power-Down Applications", Proceedings of 2004 IEEE International Symposium on Circuits and Systems (ISCAS), 2004, pp. 677-680, IEEE, 4 pages.
International Search Report and Written Opinion for International Application No. PCT/US16/16396 dated Jun. 20, 2016, 12 pages.
Vu, et al., Two-terminal floating-gate memory with van der Waals heterostructures for ultrahigh on/off ratio, Nature Communications, Sep. 2, 2016, 8 pages.
Taiwanese Office Action dated Feb. 22, 2017 for Taiwanese Application No. 105103478, 13 pages (with English translation).

\* cited by examiner

NODE RETAINER CIRCUIT INCORPORATING RRAM

PRIORITY CLAIM

The present application for patent claims the benefit of priority to U.S. Provisional Patent Application Ser. No. 62/111,632 entitled "A Node Retainer Node Incorporating RRAM" and filed Feb. 3, 2015, the disclosure of which is incorporated herein by reference in its entirety and for all purposes.

TECHNICAL FIELD

The subject disclosure relates generally to non-volatile memory, and as one illustrative example, a method and system for retaining state using a resistive random access memory cell.

BACKGROUND

The inventor(s) of the present disclosure have proposed models of two-terminal memory devices that he expects to operate as viable alternatives to various memory cell technologies, such as metal-oxide semiconductor (MOS) type memory cells employed for electronic storage of digital information. Models of memory cells using two-terminal memory such as resistive-switching memory devices among others, are believed by the inventor(s) to provide some potential advantages over purely non-volatile FLASH MOS type transistors, including smaller die size, higher memory density, faster switching (e.g., from a relatively conductive state to a relatively non-conductive state, or vice versa), good data reliability, low manufacturing cost, and other advantages, for example.

One memory model proposed by the assignee of the present disclosure is resistive switching memory. The inventor(s) believes resistive switching memory can hold substantial advantages over competing technologies in the semiconductor electronics industry, including, e.g., high density non-volatile storage. A resistive switching device, according to some models proposed by the inventor(s), has an insulator layer that is provided between a pair of electrodes and exhibits electrical pulse induced hysteretic resistance switching effects. The inventor(s) has suggested that a filament(s) can be formed between the electrodes by a diffusion or drift of ions caused by a suitable external stimulus applied to the electrodes, which results in a measurable change in the resistance of the structure. Moreover, this change in resistance can remain after removal of the external stimulus, giving the device a non-volatile characteristic in a programmed state. The inventors are currently involved in research and development to explore additional characteristics and advantages of two-terminal memory in general.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments disclosed herein provide a method for retaining state information using a retainer node circuit with a resistive switching memory cell. The method can comprise applying a write voltage to gates of a first transistor and a second transistor, wherein the resistive memory cell is between the first transistor and the second transistor. The method can also comprise receiving an inverted input at the drain or source of the first transistor and an input at the drain or source of the second transistor, wherein the inverted input and an associated input voltage are based on a state of a device connected to the retainer node circuit. The method can further comprise writing the state of the device to the resistive switching memory cell based on a voltage polarity difference between the input and the inverted input.

In another embodiment, a method for reading retained state information using a retainer node circuit with a resistive switching memory cell is provided. The method can comprise activating a first transistor, a second transistor and a third transistor, wherein a source of the second transistor and a drain of the third transistor are connected to the resistive switching memory cell and wherein the third transistor is also connected to ground, and wherein a source of the first transistor and a drain of the second transistor are connected to an output node. The method can include applying a first read signal to a gate of the first transistor. The method can include applying a second read signal to respective gates of the second transistor and the third transistor. The method can include applying a read voltage to a drain of the first transistor. The method can include measuring a voltage at the output node in response to applying the read voltage, the first read signal and the second read signal. The method can include determining the retained state information from the voltage at the output node. The method can include outputting to the output node the retained state information stored in the resistive switching memory cell in response to the voltage at the output node, wherein the output node is at zero voltage in response to the resistive switching memory cell being in a conductive state, and wherein the output node is at the read voltage in response to the resistive switching memory cell being in a resistive state.

In another embodiment, a non-volatile node retainer circuit can include an input node connected to an output node of a volatile multi-state device. The node retainer circuit can also include a write activation circuit configured, in response to a write voltage, to write an output signal at the output node of the volatile multi-state device to a non-volatile, two-terminal memory cell, wherein writing the output signal is performed in 50 nanoseconds or less and wherein the non-volatile, two-terminal memory cell stores the output signal as a stored signal. The node retainer circuit can also include a read activation circuit configured, in response to a read voltage, to output the stored signal from the non-volatile, two-terminal memory cell and a power management logic configured to apply the write voltage to the write activation circuit in response to determination of a planned power-down event or an unplanned power-down event associated with the volatile multi-state device.

In another embodiment, a method for reading retained state information using a retainer node circuit with a resistive switching memory cell can include applying a read voltage across the resistive switching memory cell. The method can include driving output of the resistive switching memory cell onto an output of the retainer node circuit. The method can also include blocking input of the retainer node circuit from driving the output of the retainer node circuit while the resistive switching memory cell is being read.

In another embodiment, a method for writing data from a volatile state device to a non-volatile memory element can include activating a write circuit associated with the volatile state device and the non-volatile memory element. The method can also include receiving an output from the volatile memory element representing the data and applying the output to a first terminal of a bipolar non-volatile memory element. The method can also include applying an inverse of the output to a second terminal of the bipolar non-volatile memory element, wherein applying the output to the first terminal and the inverse of the output to the second terminal further comprises at least one of writing a zero to the non-volatile memory element in response to the data being a low signal or writing a one to the non-volatile memory element in response to the data being a high signal.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Overview

Figure 1:
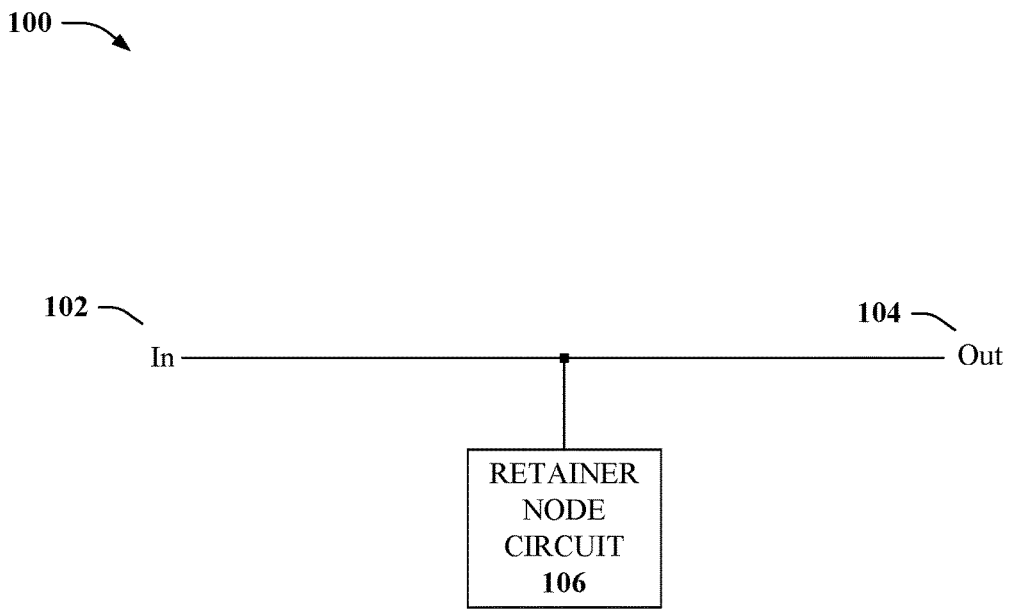
FIG. 1 illustrates a block diagram of an example retainer node circuit in accordance with various aspects described herein.

This disclosure relates to a retainer node circuit that can retain state information of a volatile multi-state component (e.g., a flip-flop, a latch, a configuration register, and so forth) of an electronic device, following power-down of the electronic device. The retainer node circuit can include a non-volatile, resistive-switching memory cell (also referred to herein as a resistive memory cell, resistive random access memory, or the like). The retainer node circuit can comprise an array of non-volatile memory elements for a set of volatile multi-state components of the electronic device. When suitable for power management configurations, state information stored in the volatile multi-state components can quickly be written to the non-volatile memory elements for storage, allowing the volatile multi-state components of the electronic device to be shut down. Utilizing resistive-switching memory as the non-volatile memory elements, transfer of state information to storage memory can be implemented very quickly (e.g., 20 ns or less), with very little power consumption. Further, upon system restoration, state information is read back from the non-volatile memory elements back to the volatile multi-state components also very quickly (e.g., 20 to 50 ns) and with low power consumption. The quick write and read-back times (e.g., under 70 ns combined) can enable a new paradigm in power-cycling, since the read-write time to non-volatile memory (e.g., 70 ns) is on a time scale that is several orders of magnitude shorter than that of application-level operations (e.g., wireless signaling, application processes, etc.).

As one illustrative example, an electronic device can perform wireless signaling on the second half of every microsecond without interruption, even where the first half of every microsecond is spent with volatile multi-state elements in sleep mode (e.g., powered-down). Less than 100 ns of the 0.5 us sleep period is consumed by writing to and reading from the non-volatile memory, leaving more than 400 ns of each microsecond at reduced power (or no power) operation. This can provide significant power savings for electronic devices, and particularly useful for devices that operate for long periods on battery power.

In various embodiments, the retainer node circuit can include a non-volatile memory cell having an input connected in parallel to an output node of a volatile multi-state component (e.g., flip-flop, latch, switch, register, etc.). Upon activation of a first set of transistors of the retainer node circuit (e.g., write transistors), a signal at the output node of the volatile multi-state component is written to the non-volatile memory cell. In an embodiment, the amount of time it takes for the retainer node circuit to write the state of a flip-flop or latch to a non-volatile, resistive-switching memory cell can be about 20 nanoseconds or less.

According to some embodiments, upon restoration of power to the set of volatile multi-state components, a second set of transistors (e.g., read transistors) can output a signal stored at the non-volatile memory cell back to the output node of the volatile multi-state component. In these embodiments, outputting the signal from the non-volatile memory cell back to the output node of the volatile multi-state component restores the output node to the state that existed prior to the above-described write operation. In alternative embodiments, the second set of transistors can output the signal stored at the non-volatile memory cell back to an input node of the volatile-multi-state component, in effect writing the stored signal back to the volatile multi-state component itself. Example circuit configurations for implementing these and other features are described herein.

In an embodiment, read or write voltages can be applied to the retainer node circuit from outside the circuit, such as from a power management controller that activates the write and read signals upon entering power down and power up cycles respectively, of a power management protocol (e.g., planned power-down, planned power-up, etc.). In an embodiment, the power management controller can monitor power source power levels, and implement the write voltage in response to determining a power failure event (e.g., unplanned power-down). The power failure event can, for instance, be determined in response to satisfaction of one or more predefined criterion(ia), such as a measured Vcc voltage source falling below a predetermined threshold, or other suitable criterion. In other embodiments, the retainer node circuit or other circuit can contain a separate power source (e.g., battery, capacitor, etc.) and simple write logic configured to write volatile state information to non-volatile memory in response to determination of the power failure event, independently of the main controller (e.g., to maximize efficiency and speed in preserving state information for the unplanned power-down).

In various embodiments, a disclosed resistive-switching memory cell can be a filamentary-based device. One example of a filamentary-based device can comprise: a conductive layer, e.g., metal, doped p-type (or n-type) silicon (Si) bearing layer (e.g., p-type or n-type polysilicon, p-type or n-type polycrystalline SiGe, etc.), a resistive switching layer (RSL) and an active metal layer capable of being ionized. Under suitable conditions, the active metal layer can provide filament forming ions to the RSL. In such embodiments, a conductive filament (e.g., formed by the ions) can facilitate electrical conductivity through at least a subset of the RSL, and a resistance of the filament-based device can be determined by a tunneling resistance between the filament and the conductive layer, or by an inherent resistivity of a conductive short through the RSL (e.g., formed by the ions forming the filament within the RSL).

In various embodiments of a non-volatile memory cell of the present disclosure, a p-type or n-type Si bearing layer can include a p-type or n-type polysilicon, p-type or n-type polycrystalline SiGe, or the like. A RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), and so forth. Other examples of materials suitable for the RSL could include $Si_X Ge_Y O_Z$ (where X, Y and Z are respective suitable positive numbers), a silicon oxide (e.g., $SiO_N$, where N is a suitable positive number), amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) and so forth, or a suitable combination thereof. In various embodiments, the RSL includes a number of material voids or defects.

An active metal layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum(Ta), iron (Fe), manganese (Mn), tungsten (W), vanadium (V), cobalt (Co), platinum (Pt), hafnium (Hf), and palladium (Pd). Other suitable conductive materials, as well as compounds, alloys, or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for application Ser. No. 11/875,541 filed Oct. 19, 2007 and application Ser. No. 12/575,921 filed Oct. 8, 2009, each of which are incorporated by reference herein in their respective entireties and for all purposes.

The inventors of the subject application are familiar with additional non-volatile, two-terminal memory structures. Ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. For instance, various subsets of these devices can have relatively fast switching times, good durability, high memory density, low cost fabrication, long life, or the like, or combinations thereof. Meanwhile, the various subsets can also be difficult to fabricate, have compatibility problems with many common CMOS fabrication processes, poor read performance, small on/off resistance ratios (e.g., leading to small sensing margin) or poor thermal stability, as well as other challenges. Though resistive-switching memory technology is considered by the inventors to be one of the best technologies having the most benefits and least detriments, other non-volatile two-terminal memory technologies, can be utilized for some of the disclosed embodiments, where suitable to one of ordinary skill in the art.

Non-Limiting Examples of Retainer Node Circuit Containing a Resistive Switching Memory Cell that Stores State Information Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring now to the drawings, in FIG. 1 illustrated is a block diagram 100 of an example retainer node circuit 106 in accordance with various aspects described herein. Retainer node circuit 106 can include a resistive-switching memory cell (e.g., resistive random access memory, and so on) that is a non-volatile memory cell that saves state information associated with a flip-flop or latch in a computing device. In an embodiment, the retainer node circuit 106 can save the state information at an input 102 and write it to an resistive-switching memory cell in the retainer node circuit during a power down cycle, and then a flip-flop/latch at that output 104 can determine the saved state information from the retainer node circuit 106 during a bootup or power up cycle.

In an embodiment, an input node of the retainer node circuit 106 can be connected to an output node of a volatile multi-state device (e.g., at input 102). A write activation circuit in the retainer node circuit 106 can be configured, in response to a write voltage, to write an output signal at the output node of the volatile multi-state device connected to input 102 to a non-volatile, two-terminal memory cell in the retainer node circuit 106. The writing of the output signal is performed in 50 nanoseconds or less (e.g., about 25 ns, about 20 ns, etc.) and the non-volatile, two-terminal memory cell stores the output signal as a stored signal. A read activation circuit in the retainer node circuit 106 can then be configured, in response to a read voltage, to output the stored signal from the non-volatile, two-terminal memory cell to the output 104 which can be connected to the input of another volatile multi-state device connected to the output 104. The retainer node circuit can include a power management logic or circuit configured to apply the write voltage to the write activation circuit in response to determination of a planned power-down event or an unplanned power-down event associated with the volatile multi-state device.

In an embodiment, the input multi-state device/latch 102 and the output multi-state device/latch 104 can be the same latch. Therefore, the retainer node circuit 106 writes the state information of the latch into memory, and then upon booting or powering up, the retainer node circuit 106 restores the state information to the flip-flop/latch that was powered down.

Figure 2:
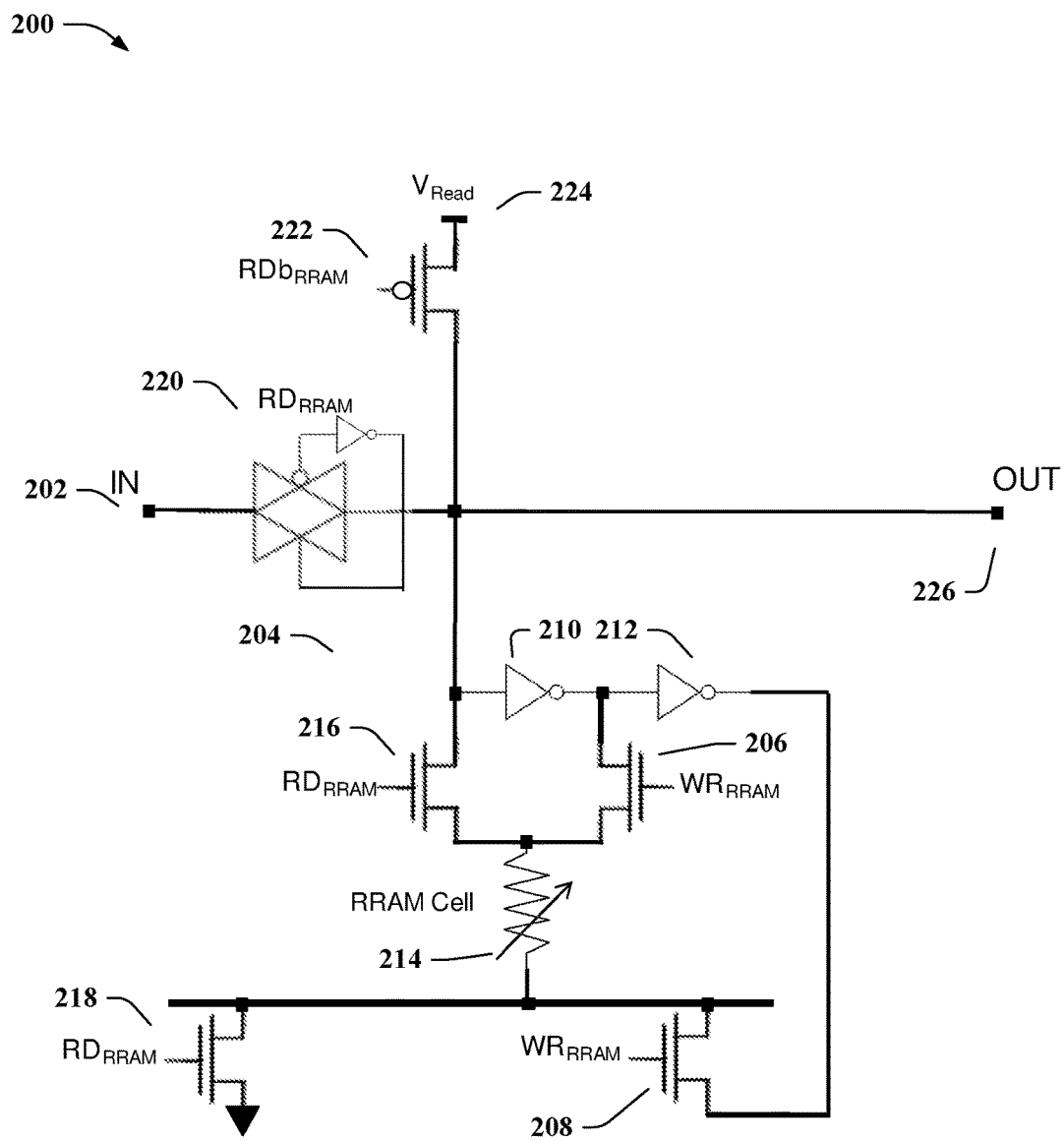
FIG. 2 illustrates a schematic diagram of an example retainer node circuit with a RRAM memory cell in accordance with various aspects described herein.

Turning to FIG. 2, illustrated is a schematic diagram 200 of an example retainer node circuit 204 with an RRAM memory cell 214 in accordance with various aspects described herein.

The retainer node circuit 204 can include a resistive random access memory cell that is a non-volatile memory cell that saves state information associated with a flip-flop or latch in a computing device. In an embodiment, the retainer node circuit 204 can save the state information from an input 202 and write it to the RRAM memory cell 214 in the retainer node circuit during a power down cycle, and then a flip-flop/latch at that output 226 can determine the saved state information from the retainer node circuit 204 during a bootup or power up cycle by applying a read voltage signal $RD_{RRAM}$ to the retainer node circuit 204.

During normal operation, at a time other than the power down or power up sign, the node retainer circuit is effectively disconnected from the input/output 202/226 circuit. When a power down sequence has been initiated however, or in response to the node retainer circuit determining that a supply voltage has decreased below a predetermined threshold, a write voltage $WR_{RRAM}$ can be applied to the gates of transistors 206 and 208. Applying the $WR_{RRAM}$ voltage in this way closes the circuit on the right hand side of the retainer node circuit 204 and enables retainer node circuit 204 to write a signal at the input 202 to the resistive switching memory cell 214. In the embodiment of FIG. 1, writing the signal from the input 202 is accomplished by the following circuit logic. The signal from the input 202 is inversed at inverter 210, and is connected through the transistor 206 (which is closed in response to the write voltage) to the top of the resistive switching memory cell 214. Accordingly, retainer node circuit 204 is configured to apply the inverse of the signal at input 202 to a top terminal of resistive switching memory cell 214. The inverted signal from the input 202 is then inverted again at inverter 212 and passes through the transistor 208 (which is also closed in response to the write voltage) to a bottom terminal of the resistive switching memory cell 214. This signal at the bottom terminal, having passed through the inverter 212, is opposite in polarity to the signal at the top terminal of the resistive switching memory cell 214 and the difference, or bias, programs the resistive switching memory cell 214 to either be in a resistive or conductive state, depending on the initial signal from the input 202 (and, e.g., the orientation of resistive switching memory cell 214).

It should be appreciated that the conductive/resistive state of the resistive switching memory cell 214 can be assigned by convention to a low/high state of input 202, or vice-versa, by convention. Reversing orientation of resistive switching memory cell 214 (e.g., where an active metal donating filament-forming particles is at the top electrode, in one embodiment, or at the bottom electrode, in another embodiment) can serve to change the association of cell state to bit convention (e.g., whether high or low), as one example. It should be appreciated that the present disclosure is not limited by the cell state—bit convention chosen, as other conventions can be utilized and are considered within the scope of the subject disclosure.

The resistive or conductive state of the resistive switching memory cell 214 thus reflects the binary state of the flip-flop or latch associated with the input 202. This entire procedure of writing to the resistive switching memory cell 214 can take about 20 ns or less in some disclosed embodiments, which is far superior to earlier versions of memory-based state retainer solutions. After the write procedure is complete, the write voltage $WR_{RRAM}$ is removed to once again open transistors 206, 208 and deactivate the right side of retainer node circuit 204.

When the system is powering back up, a read voltage $RD_{RRAM}$ can be applied to the gates of transistors 216 and 218 which effectively activates the left hand side of the retainer node circuit 214 by closing transistors 216, 218. In addition, the $RD_{RRI}$ voltage can be applied to a transmission gate 220 which blocks the signal at input 202 from interfering with the read (e.g., by isolating the signal at input 202 from the common node at the center of schematic diagram 200, just to the right of transmission gate 220). A reversed $RD_{RRAM}$ voltage, $RDb_{RRAM}$ can also be applied to pmos transistor 222, which connects a read voltage source $V_{read}$ to the common node of schematic diagram 200 (and consequently the input of retainer node circuit 204). $RDb_{RRAM}$ can be the inverted, or active low version of $RD_{RRAM}$. If the resistive switching memory cell 214 is in a conductive state, since transistor 218 is grounded, the $V_{read}$ signal will be pulled down to ground through the conducting resistive switching memory cell 214, and the voltage as measured at the common node and at the output at 226 will be zero (or approximately zero). By contrast, if the resistive switching memory cell 214 is in a resistive state, the voltage as measured at the output 226 will be the approximately equal in magnitude to $V_{read}$. Schematic diagram 200 is configured so that the absence or presence of a $V_{read}$ at output 226 reflects the state of the flip-flop or latch (e.g., the signal at input 202) at the time of power down.

Resistive switching memory cell 214 can be a two-terminal device configured to be operable in response to a suitable electric signal applied at one or more of two terminals of resistive switching memory cell 214. In various disclosed embodiments, resistive switching memory cell 214 can have a non-linear I-V response, in which resistive switching memory cell 214 exhibits current within a first range in response to a first range of voltage magnitudes, and current within a second range (e.g., much higher in magnitude than the first range) in response to a second range of voltage magnitudes. The first range of voltage magnitudes and second range of voltage magnitudes can be distinguished, as one example, by a threshold voltage, or a threshold range of voltages (e.g., having magnitude(s) between the first range of voltage magnitudes and the second range of voltage magnitudes). In addition, resistive switching memory cell 214 can be characterized by a write time of less than about 50 ns, and equal to or below 20 ns in some embodiments. Resistive switching memory cell 214 can alternatively or additionally be characterized by a read time of less than about 50 ns, and equal to or below 20 ns in one or more embodiments.

In one or more embodiments, the top electrode and bottom electrode of resistive switching memory cell 214 can comprise a material(s) providing or facilitating provision of mobile atoms or ions in response to a suitable stimulus. Examples of suitable stimuli can include an electric field (e.g. a programming voltage), joule heating, a magnetic field, or other suitable stimuli for directed or partially directed particle motion. In at least one embodiment, particle mobility can be in response to undirected or partially undirected dispersion, or similar phenomena.

Examples of suitable materials for the top electrode or bottom electrode of resistive switching memory cell 214 can include a noble metal (e.g., Ag, Pd, Pt, Au, etc.) or a metal alloy containing noble metal in part (e.g., Ag—Al, Ag—Pd—Cu, Ag—W, Ag—Ti, Ag—TiN, Ag—TaN, and so forth). A noble metal or alloy thereof can be utilized to facilitate mitigated interaction between the top electrode or the bottom electrode and a switching layer of resistive switching memory cell 214 situated between the top electrode and the bottom electrode, for instance. This mitigated particle interaction can facilitate improved longevity and reliability for resistive switching memory cell 214, as one example. Another example of a suitable material for the top electrode or the bottom electrode can include a material with relatively fast diffusing particles. Faster diffusion can include, for instance, a capacity to move among defect sites (e.g., voids or gaps in molecular material) within a solid, facilitating dispersion of the relatively fast diffusion particles absent a suitable aggregating force, for instance (e.g., an external voltage of greater than a threshold magnitude). Materials with relatively fast diffusing particles can facilitate fast state switching of resistive switching memory cell 214 (e.g., from a non-conductive state to a conductive state), at lower bias values. Examples of suitable fast diffusing materials can include Ag, Cu, Au, Co, Ni, Al, Fe, or the like, suitable alloys thereof, or suitable combinations of the foregoing. In a further embodiment, resistive switching memory cell 214 can comprise one or more barrier layers to mitigate oxidation or other form of material degradation, diffusion mitigation layers to mitigate diffusion of atoms (e.g., metal atoms, such as Cu) out of resistive switching memory cell 214, or maintain such atoms within desired portions of resistive switching memory cell 214, or the like.

In at least one embodiment, the top electrode of resistive switching memory cell 214 can be comprised of the same material or substantially the same material as the bottom electrode of resistive switching memory cell 214. In other embodiments, the top electrode and bottom electrode can be different materials. In still other embodiments, the top electrode and bottom electrode can be at least in part the same material, and in part different materials. For instance, the top electrode could comprise a suitable conductive material, and the bottom electrode could at least in part comprise an alloy of the suitable conductive material, or the suitable conductive material in combination with another suitable conductor, as an illustrative example.

In response to a suitable signal applied at resistive switching memory cell 214, resistive switching memory cell 214 can transition from a non-conducting state having a high electrical resistance and a first current (or a first range of currents), to a relatively-conducting state having a lower electrical resistance and a second current (or a second range of currents). In various embodiments, a current ratio of the first current to the second current (also referred to as an on/off current ratio) can be at least about 1,000 or more. In other embodiments the on/off current ration can be 1:10,000, 1:100,000, or even greater proportions.

Figure 3:
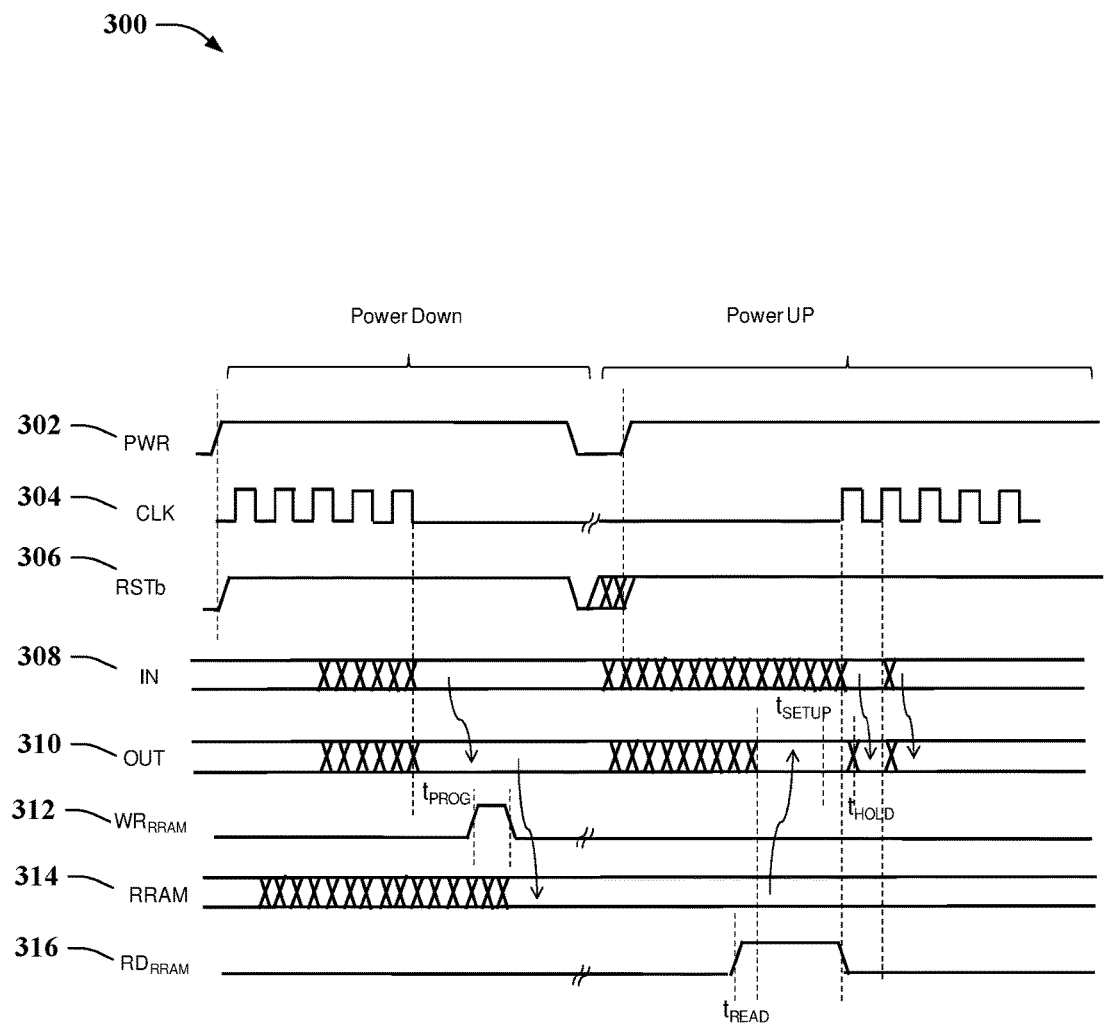
FIG. 3 illustrates a timeline showing timing of operations of a retainer node circuit in accordance with various aspects described herein.

Turning now to FIG. 3, illustrated is a timeline 300 showing timing of operations of a retainer node circuit in accordance with various aspects described herein. The timeline 300 shows activity of various components and functions of the retainer node circuit as described above with regard to FIG. 2 along a spectrum time, generally separated into a power down time, and a power up time. At 302, the PWR represents the power to the system, and is generally on except for a length of time between the power down and power up cycles. Since the resistive switching memory cell 214 is non-volatile, and can save the state of the node for a long period of time, the time during a power off can be significant. Although in some embodiments, power off time can be relatively short, such as a few hundred nanoseconds. In these latter embodiments, power-on and power-off can be cycled frequently, for instance every microsecond or every few microseconds, to achieve significant power savings with minimal impact to device operation. This frequent cycling of power-down operations can be implemented in conjunction with longer duration power-off operations, such as when applications of an associated electronic device are not operating.

The CLK 304 represents the clock signal and is present near the beginning of the power down cycle, and near the end of the power up signal, before and after the state information has been saved and recovered from the resistive switching memory cell 214 by the retainer node circuit 204.

The RSTb 306 represents the reset cycle in between the power down and power up cycles. The IN 308 represents the input, and OUT 310 represents the output. The input 308 is generally not known by the retainer node circuit 204 until the $WR_{RRAM}$ signal 312 is applied in the power down cycle. Once the $WR_{RRAM}$ 312 signal is applied to the transistors of the retainer node circuit 204, the state of the input 308 is written to the RRAM 314, which stores the state until rewritten.

During the power up cycle, a $RD_{RRAM}$ signal 316 is applied to the transistors of the retainer node circuit 204, and the state stored in the RRAM 314 is applied to the output 310, and once the clock 304 starts again, the state of the input and output 308 and 310 sequentially change in time with the clock signal 304.

Figure 4:
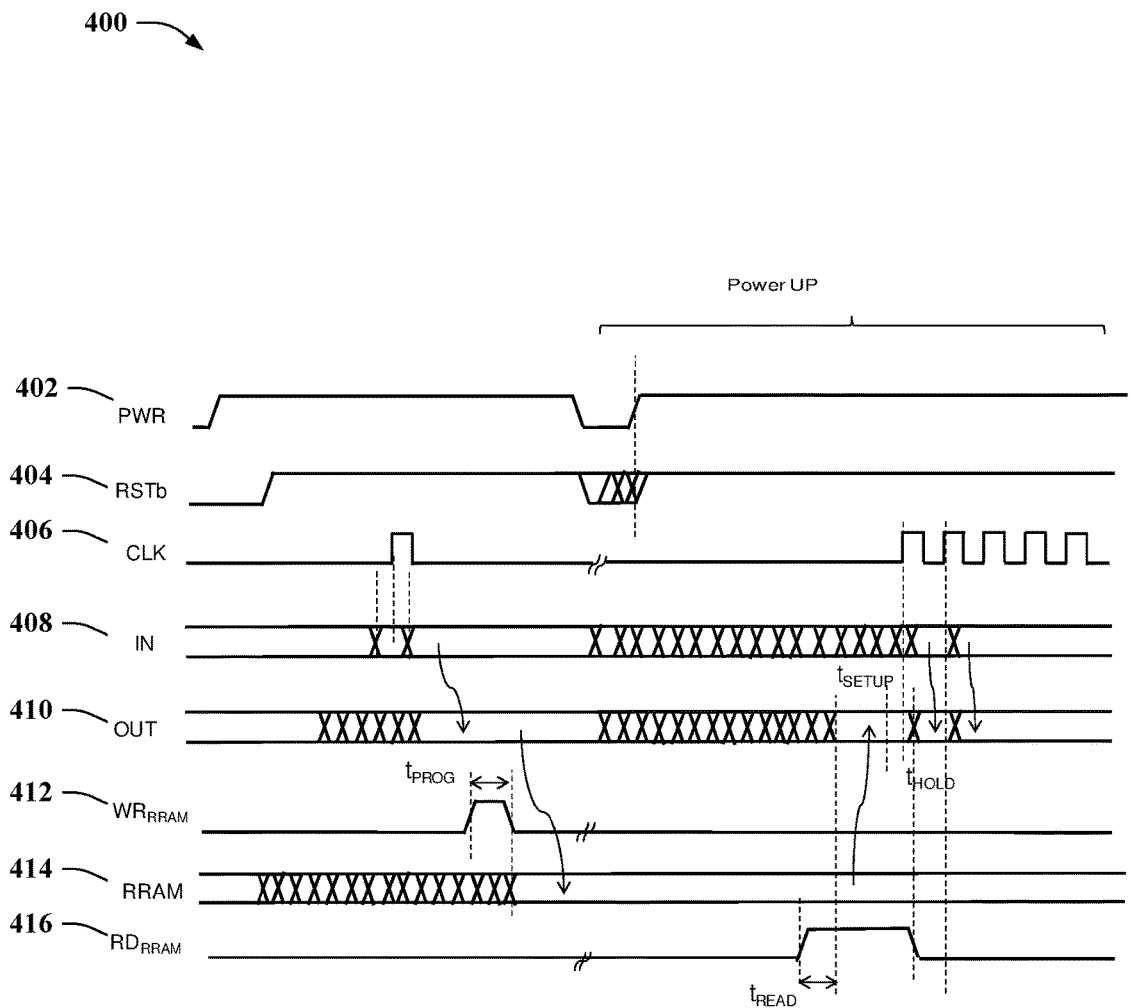
FIG. 4 illustrates a timeline showing timing of operations of a retainer node circuit in accordance with various aspects described herein.

Turning now to FIG. 4, illustrated is a timeline 400 showing timing of operations of a retainer node circuit in accordance with various aspects described herein. The timeline 400 shows a timing diagram to preconfigure the state of the flip-flop or latch into the RRAM 414.

At 402, the PWR represents the power to the system, and is generally on except for a length of time between the programming cycle and power up cycles. Since the resistive switching memory cell 414 is non-volatile, and can save the state of the node for a long period of time, the time during a power off can be significant.

The CLK 406 represents the clock signal and is present near the end of the power up cycle, after the state information has been recovered from the resistive switching memory cell 414 by the retainer node circuit. The CLK 406 is also active very briefly in the programming cycle to set the state at the input 408.

The RSTb 404 represents the reset cycle in between the programming cycle and power up cycles. The IN 408 represents the input, and OUT 410 represents the output. The input 408 is generally not known until the $WR_{RRM}$ signal 412 is applied in the programming cycle. Once the $WR_{RRAM}$ 412 signal is applied, the state of the input 348 is written to the RRAM 414, which stores the state until rewritten.

During the power up cycle, a $RD_{RRAM}$ signal 416 is applied, and the state stored in the RRAM 414 is applied to the output 410, and once the clock 406 starts again, the state of the input and output 408 and 410 sequentially change in time with the clock signal 406.

Figure 5:
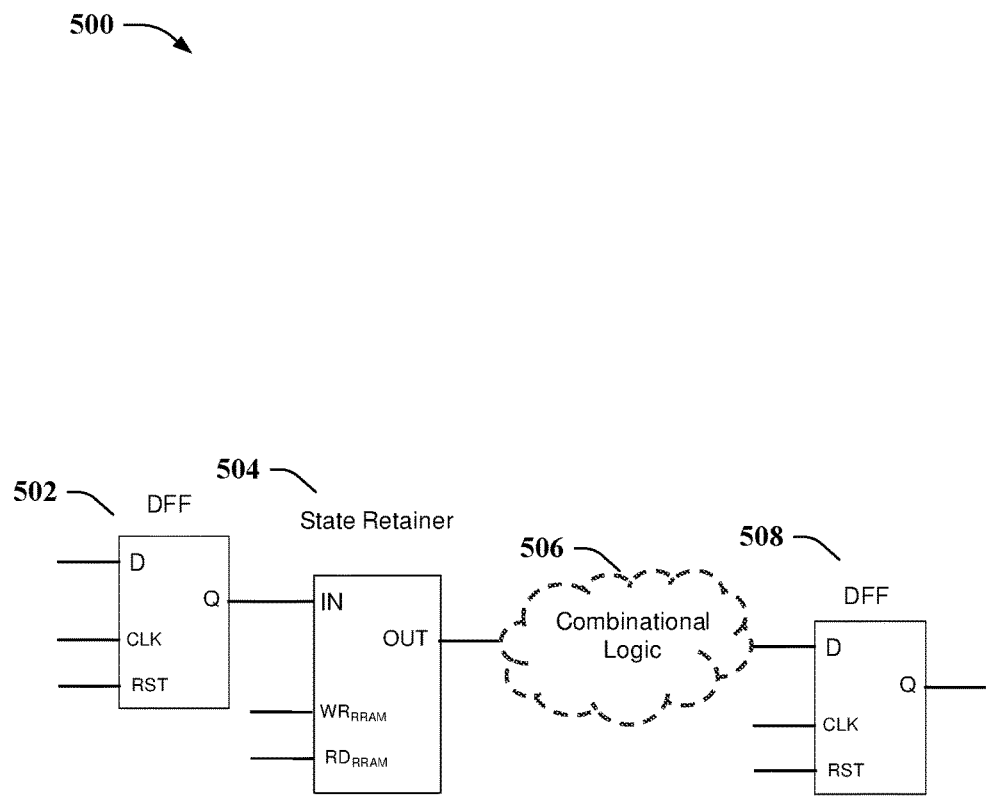
FIG. 5 illustrates a block diagram of an example retainer node circuit in accordance with various aspects described herein.

Turning now to FIG. 5, illustrated is a block diagram 500 of an example retainer node circuit in accordance with various aspects described herein. State retainer 504, which can correspond to the retainer node circuit 204 in some embodiments, is provided to retain the state information of a data flip flop 502 which stores state information received at D and provides the state information at Q. The state retainer 504 saves the state information received at Q when a $WR_{RRAM}$ signal is applied until a power up cycle initiates. When the power up cycle initiates, the $RD_{RRAM}$ signal is applied and the state retainer 504 provides the output, and combinational logic 506 deciphers the output to determine the state information of data flip flop 502, and then the data flip flop 508 receives the state information from the combinational logic 506, and the power up cycle has completed.

Figure 6:
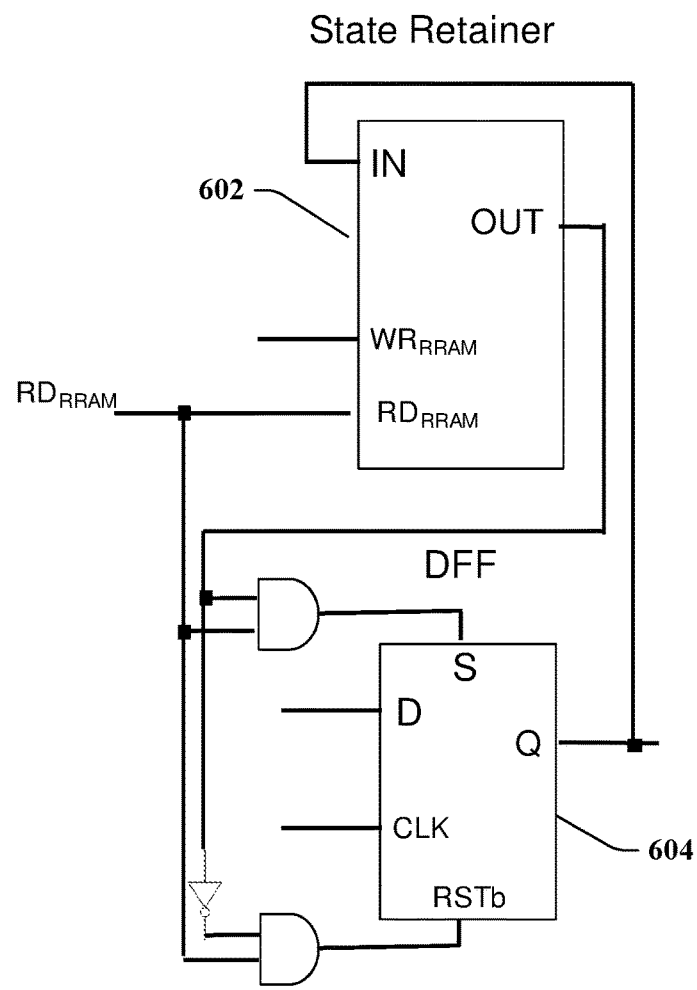
FIG. 6 illustrates a block diagram of an example retainer node circuit in accordance with various aspects described herein.

Turning now to FIG. 6, illustrated is a block diagram 600 of an example retainer node circuit in accordance with various aspects described herein. Diagram 600 is similar to the embodiment shown in FIG. 5, but that there is only one data flip flop 604. State retainer 602 stores the state information of data flip flop 604 and then upon powering up or booting up, the state retainer information provides the state information to data flip flop 604.

Figure 7:
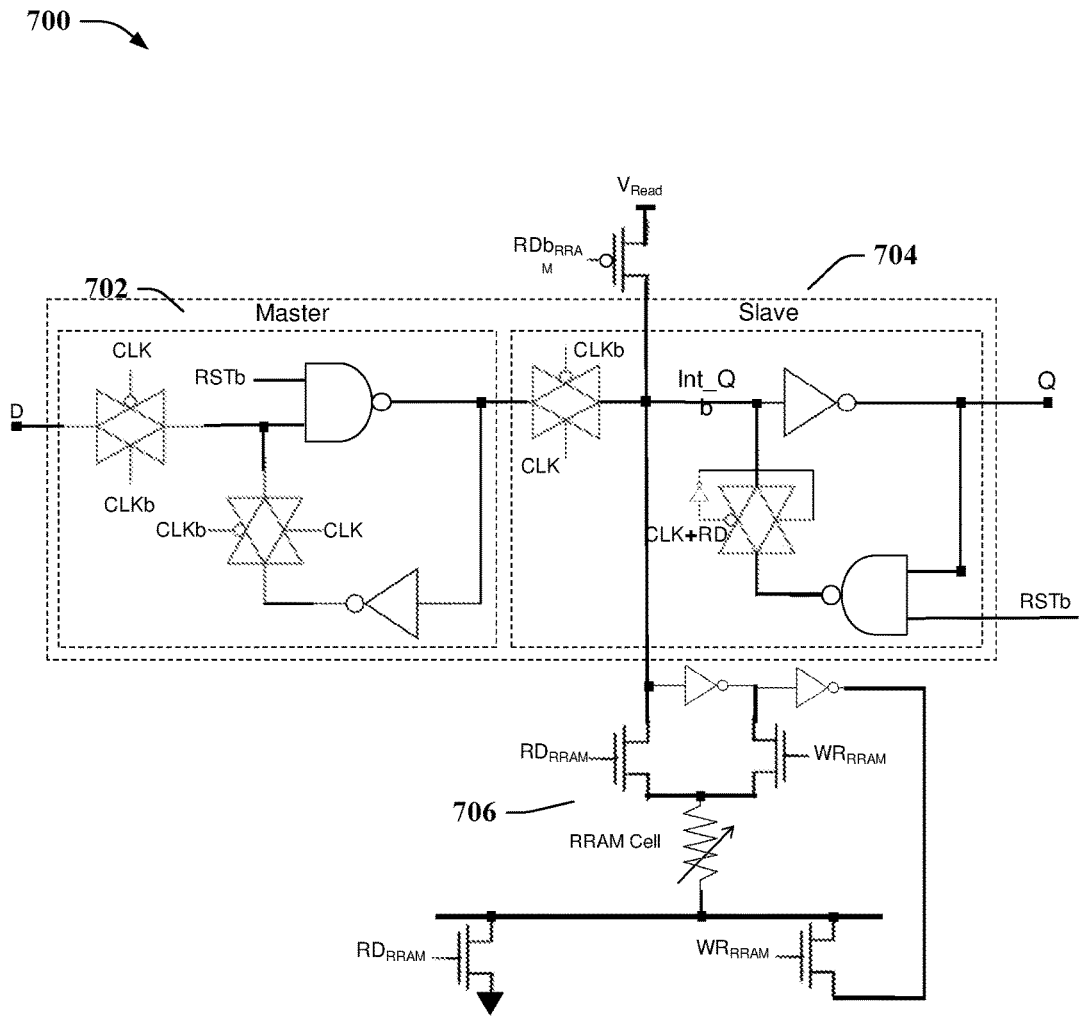
FIG. 7 illustrates a block diagram of an example retainer node circuit in accordance with various aspects described herein.

Turning now to FIG. 7, illustrated is a block diagram 700 of an example retainer node circuit 706 in accordance with various aspects described herein. Retainer node circuit 706 stores the state information of master latch 702 and then upon powering up or booting up, the state information stored in the retainer node circuit 706 is provided to slave latch 704.

The aforementioned diagrams have been described with respect to interaction between several components of a memory cell, or memory architectures comprised of such memory cells. It should be appreciated that in some suitable alternative aspects of the subject disclosure, such diagrams can include those components and architectures specified therein, some of the specified components/architectures, or additional components/architectures. Sub-components can also be implemented as electrically connected to other sub-components rather than included within a parent architecture. Additionally, it is noted that one or more disclosed processes can be combined into a single process providing aggregate functionality. For instance, a read process or a write process can comprise an inhibit process, or the like, or vice versa, to facilitate selective reading or writing to subsets of memory cells on a common line. Components of the disclosed architectures can also interact with one or more other components not specifically described herein but known by those of skill in the art.

In view of the exemplary diagrams described supra, process methods that can be implemented in accordance with the disclosed subject matter will be better appreciated with reference to the flow chart of FIG. 8-11. While for purposes of simplicity of explanation, the methods of FIG. 8-11 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any suitable computer-readable device, device in conjunction with a carrier, storage medium, or the like, or a suitable combination thereof.

Figure 8:
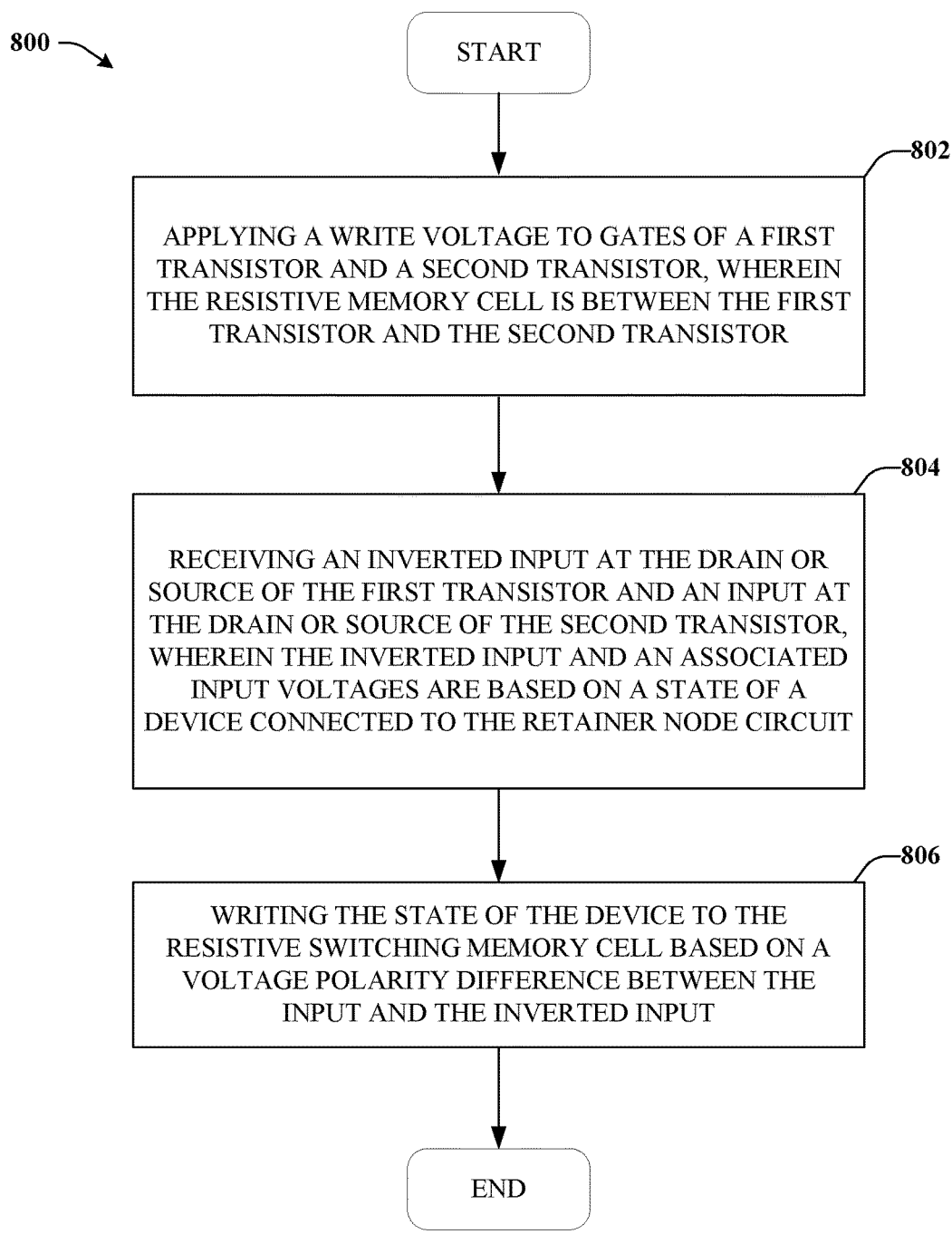
FIG. 8 illustrates a flowchart of an example method for retaining state information using a retainer node circuit according to one or more embodiments disclosed herein.

Turning now to FIG. 8, a flowchart of an example method for retaining state information using a retainer node circuit according to one or more embodiments disclosed herein is illustrated. Flowchart 800 can begin at 802 where the method includes applying a write voltage to respective gates of a first transistor and a second transistor, wherein the resistive memory cell is between the first transistor and the second transistor. At 804, the method includes receiving an inverted input at the drain or source of the first transistor and an input at the drain or source of the second transistor, wherein the inverted input and an associated input voltage are based on a state of a device connected to the retainer node circuit. At 806 the method includes in response to a voltage polarity difference between the input and the inverted input, writing the state of the device to the resistive switching memory cell.

Figure 9:
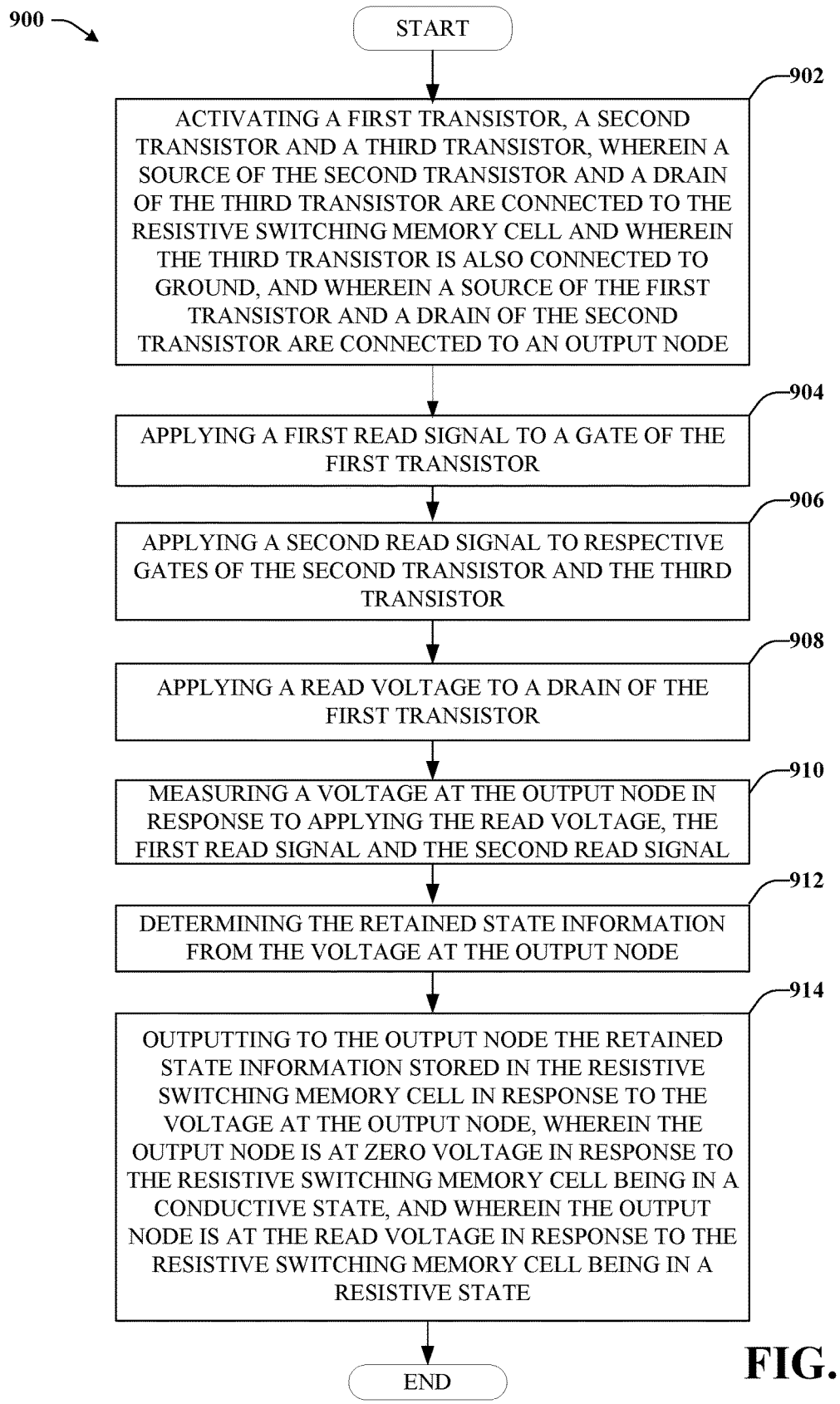
FIG. 9 illustrates a flowchart of an example method for reading retained state information using a retainer node circuit according to one or more embodiments disclosed herein.

Turning now to FIG. 9, a flowchart of an example method for reading retained state information using a retainer node circuit according to one or more embodiments disclosed herein. Flowchart 900 can begin at 902 where the method includes activating a first transistor, a second transistor and a third transistor, wherein a source of the second transistor and a drain of the third transistor are connected to the resistive switching memory cell and wherein the third transistor is also connected to ground, and wherein a source of the first transistor and a drain of the second transistor are connected to an output node. At 904 the method can include applying a first read signal to a gate of the first transistor. At 906, the method can include applying a second read signal to respective gates of the second transistor and the third transistor. And at 908, the method can include applying a read voltage to a drain of the first transistor. At 910, the method can include measuring a voltage at the output node in response to applying the read voltage, the first read signal and the second read signal. At 912, the method can include determining the retained state information from the voltage at the output node. At 914, the method can include outputting to the output node the retained state information stored in the resistive switching memory cell in response to the voltage at the output node, wherein the output node is at zero voltage in response to the resistive switching memory cell being in a conductive state, and wherein the output node is at the read voltage in response to the resistive switching memory cell being in a resistive state.

Figure 10:
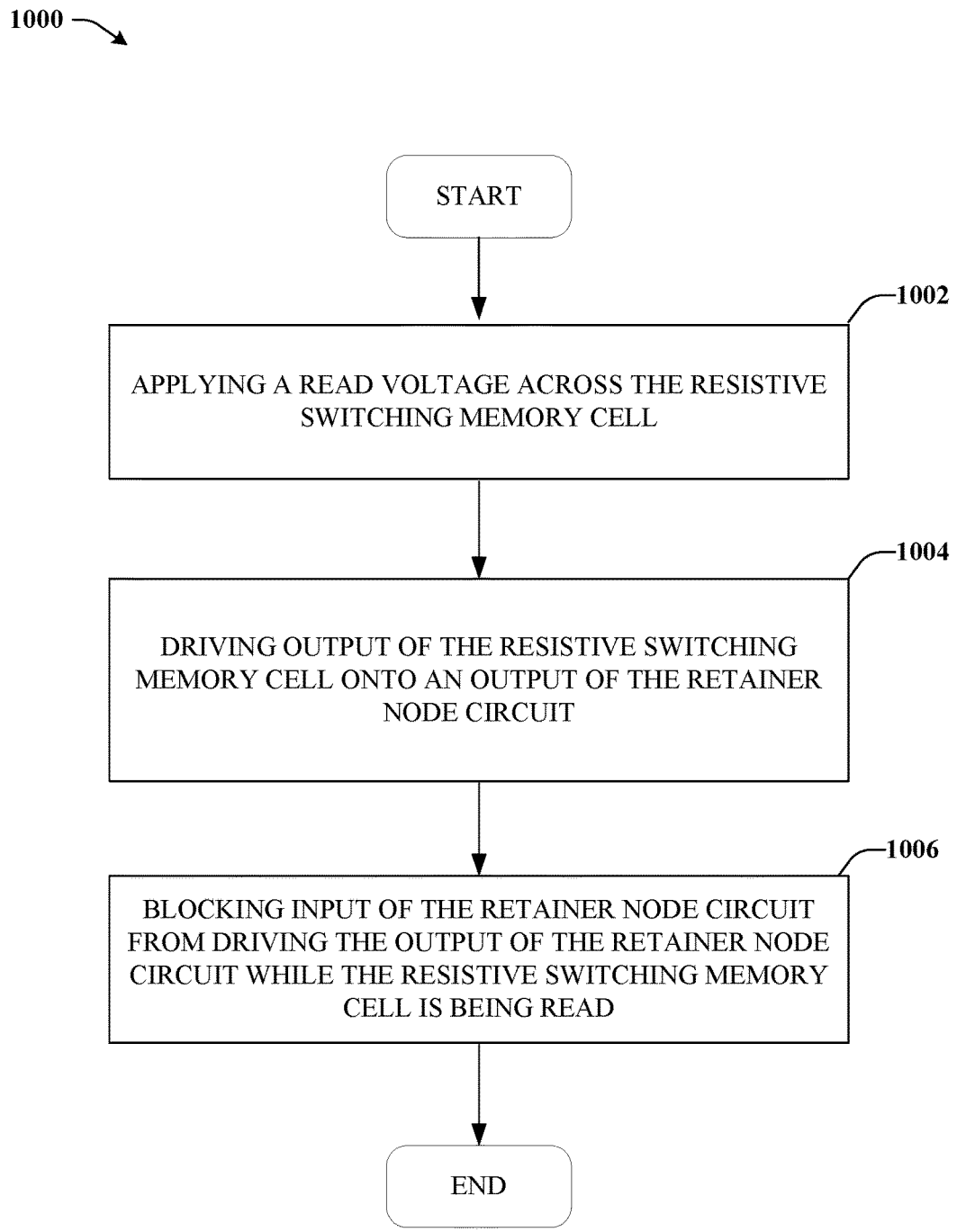
FIG. 10 illustrates a flowchart of an example method for reading retained state information using a retainer node circuit with a resistive switching memory cell according to one or more embodiments disclosed herein.

Turning now to FIG. 10, a flowchart of an example method for reading retained state information using a retainer node circuit with a resistive switching memory cell according to one or more embodiments disclosed herein is illustrated. Flowchart 1000 can begin at 1002 where the method includes applying a read voltage across the resistive switching memory cell. At 1004, the method includes driving output of the resistive switching memory cell onto an output of the retainer node circuit. At 1006 the method includes blocking input of the retainer node circuit from driving the output of the retainer node circuit while the resistive switching memory cell is being read.

Figure 11:
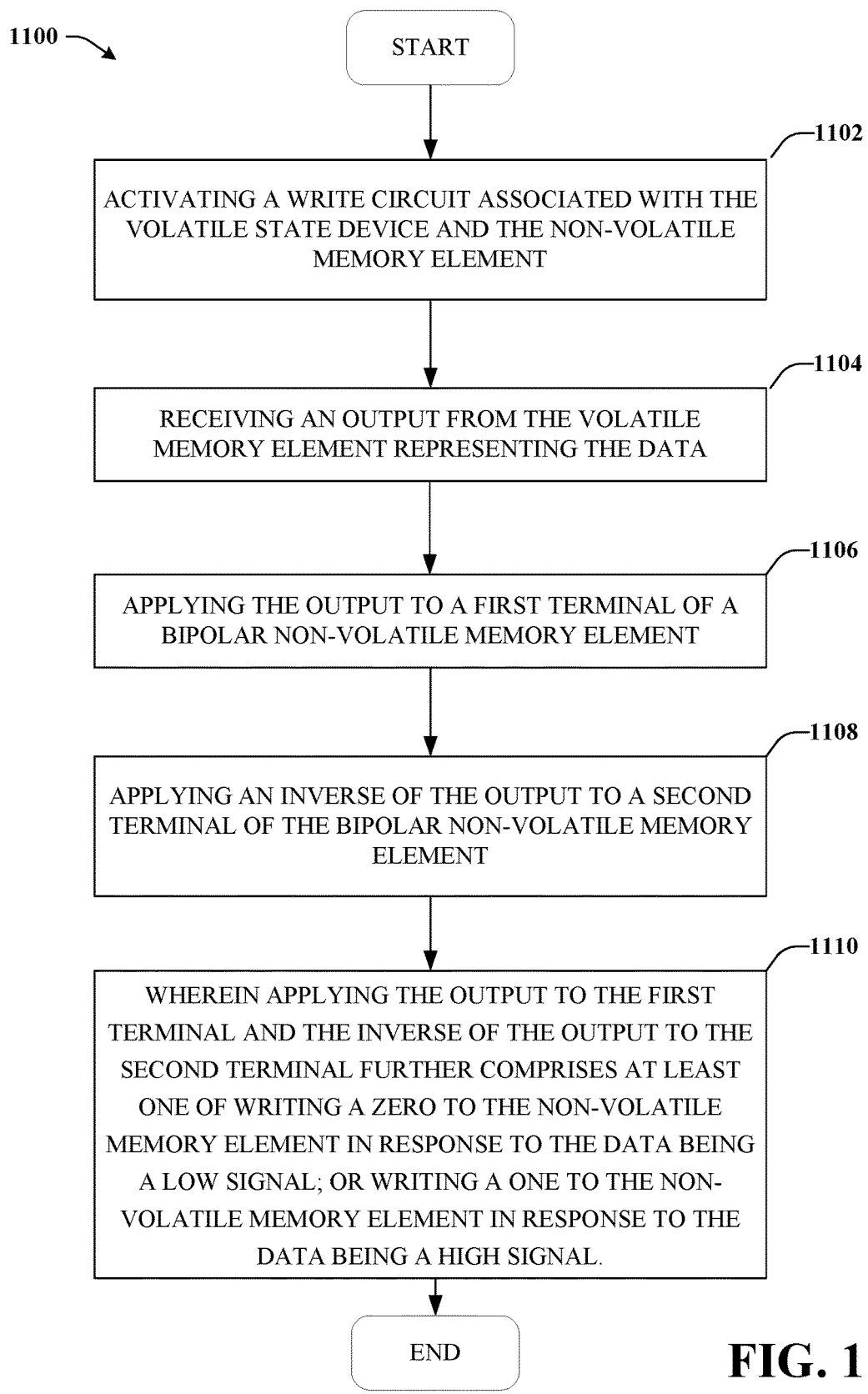
FIG. 11 illustrates a flowchart of an example method for reading writing data from a volatile state device to a non-volatile memory element according to one or more embodiments disclosed herein.

Turning now to FIG. 11, flowchart of an example method for reading writing data from a volatile state device to a non-volatile memory element according to one or more embodiments disclosed herein. Flowchart 1100 can begin at 1102 where the method includes activating a write circuit associated with the volatile state device and the non-volatile memory element. At 1104, the method includes receiving an output from the volatile memory element representing the data. At 1106 the method includes applying the output to a first terminal of a bipolar non-volatile memory element. At 1108, the method includes applying an inverse of the output to a second terminal of the bipolar non-volatile memory element. At 1110, the method includes wherein applying the output to the first terminal and the inverse of the output to the second terminal further comprises at least one of writing a zero to the non-volatile memory element in response to the data being a low signal or writing a one to the non-volatile memory element in response to the data being a high signal.

Example Operating Environments

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 12 and 13, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, the inventors have identified several structural, performance, and reliability problems that became evident to them. These or similar considerations can be addressed by some or all of the disclosed aspects.

Figure 12:
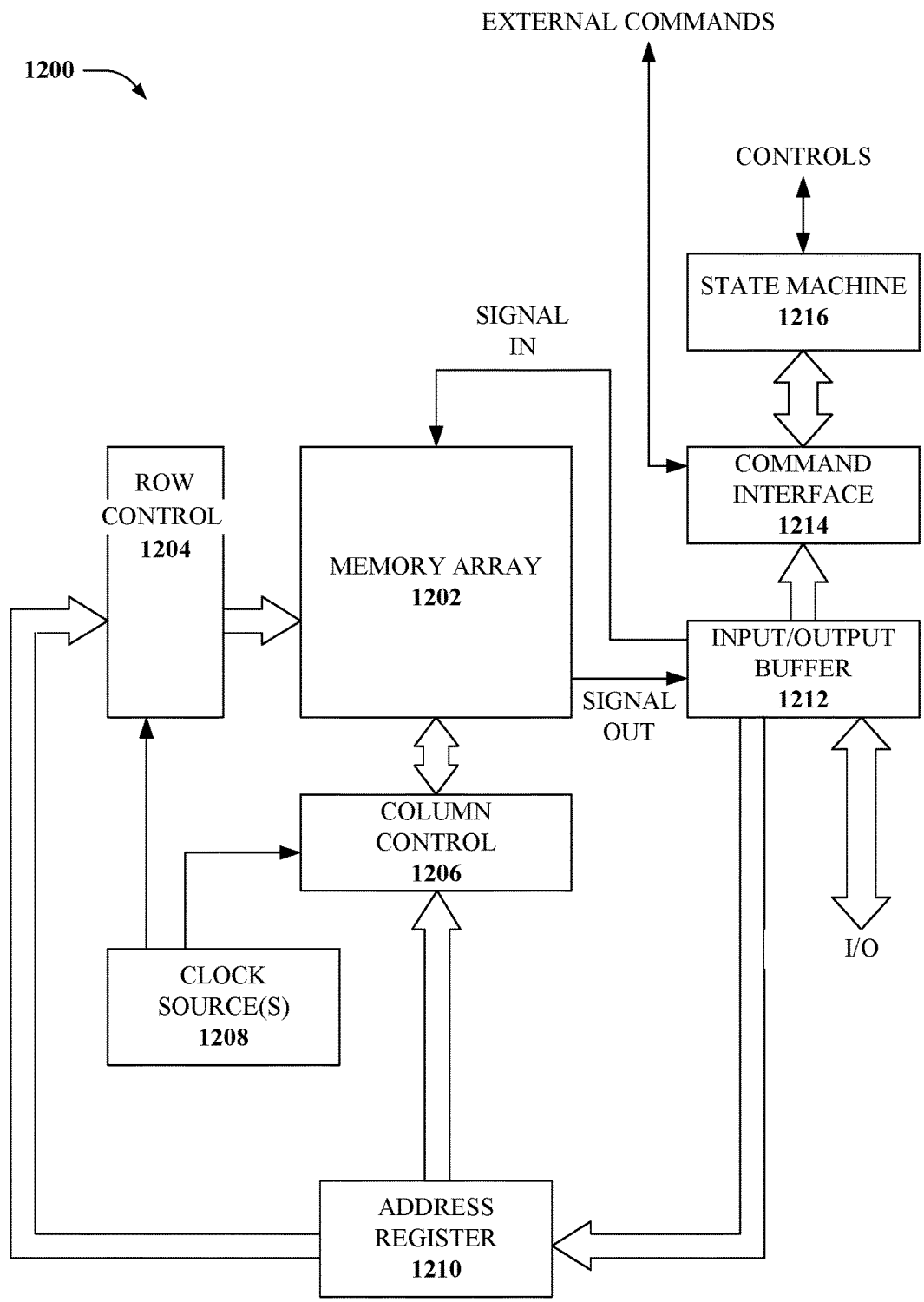
FIG. 12 depicts a block diagram of a sample operating environment for facilitating implementation of one or more aspects disclosed herein.

In order to provide a context for the various aspects of the disclosed subject matter, FIG. 12, as well as the following discussion, is intended to provide a brief, general description of a suitable environment in which various aspects of the disclosed subject matter can be implemented or processed. While the subject matter has been described above in the general context of electronic memory and process methods for fabricating or operating the electronic memory, those skilled in the art will recognize that the subject disclosure also can be implemented in combination with other components/layers of memory, memory architectures or process methodologies. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 12 illustrates a block diagram of an example operating and control environment 1200 for a memory cell array 1202 according to aspects of the subject disclosure. In at least one aspect of the subject disclosure, memory cell array 1202 can comprise a variety of memory cell technology. Particularly, memory cell array 1202 can comprise two-terminal memory such as resistive memory cells with a resistive switching medium formed via ion implantation to a conductive polysilicon material, as described herein.

A column controller 1206 can be formed adjacent to memory cell array 1202. Moreover, column controller 1206 can be electrically coupled with bit lines of memory cell array 1202. Column controller 1206 can control respective bitlines, applying suitable program, erase or read voltages to selected bitlines.

In addition, operating and control environment 1200 can comprise a row controller 1204. Row controller 1204 can be formed adjacent to column controller 1206, and electrically connected with word lines of memory cell array 1202. Row controller 1204 can select particular rows of memory cells with a suitable selection voltage. Moreover, row controller 1204 can facilitate program, erase or read operations by applying suitable voltages at selected word lines.

A clock source(s) 1208 can provide respective clock pulses to facilitate timing for read, write, and program operations of row control 1204 and column control 1206. Clock source(s) 1208 can further facilitate selection of word lines or bit lines in response to external or internal commands received by operating and control environment 1200. An input/output buffer 1212 can be connected to an external host apparatus, such as a computer or other processing device (not depicted) by way of an I/O buffer or other I/O communication interface. Input/output buffer 1212 can be configured to receive write data, receive an erase instruction, output readout data, and receive address data and command data, as well as address data for respective instructions. Address data can be transferred to row controller 1204 and column controller 1206 by an address register 1210. In addition, input data is transmitted to memory cell array 1202 via signal input lines, and output data is received from memory cell array 1202 via signal output lines. Input data can be received from the host apparatus, and output data can be delivered to the host apparatus via the I/O buffer.

Commands received from the host apparatus can be provided to a command interface 1214. Command interface 1214 can be configured to receive external control signals from the host apparatus, and determine whether data input to the input/output buffer 1212 is write data, a command, or an address. Input commands can be transferred to a state machine 1216.

State machine 1216 can be configured to manage programming and reprogramming of memory cell array 1202. State machine 1216 receives commands from the host apparatus via input/output interface 1212 and command interface 1214, and manages read, write, erase, data input, data output, and like functionality associated with memory cell array 1202. In some aspects, state machine 1216 can send and receive acknowledgments and negative acknowledgments regarding successful receipt or execution of various commands.

To implement read, write, erase, input, output, etc., functionality, state machine 1216 can control clock source(s) 1208. Control of clock source(s) 1208 can cause output pulses configured to facilitate row controller 1204 and column controller 1206 implementing the particular functionality. Output pulses can be transferred to selected bit lines by column controller 1206, for instance, or word lines by row controller 1204, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 13, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 13:
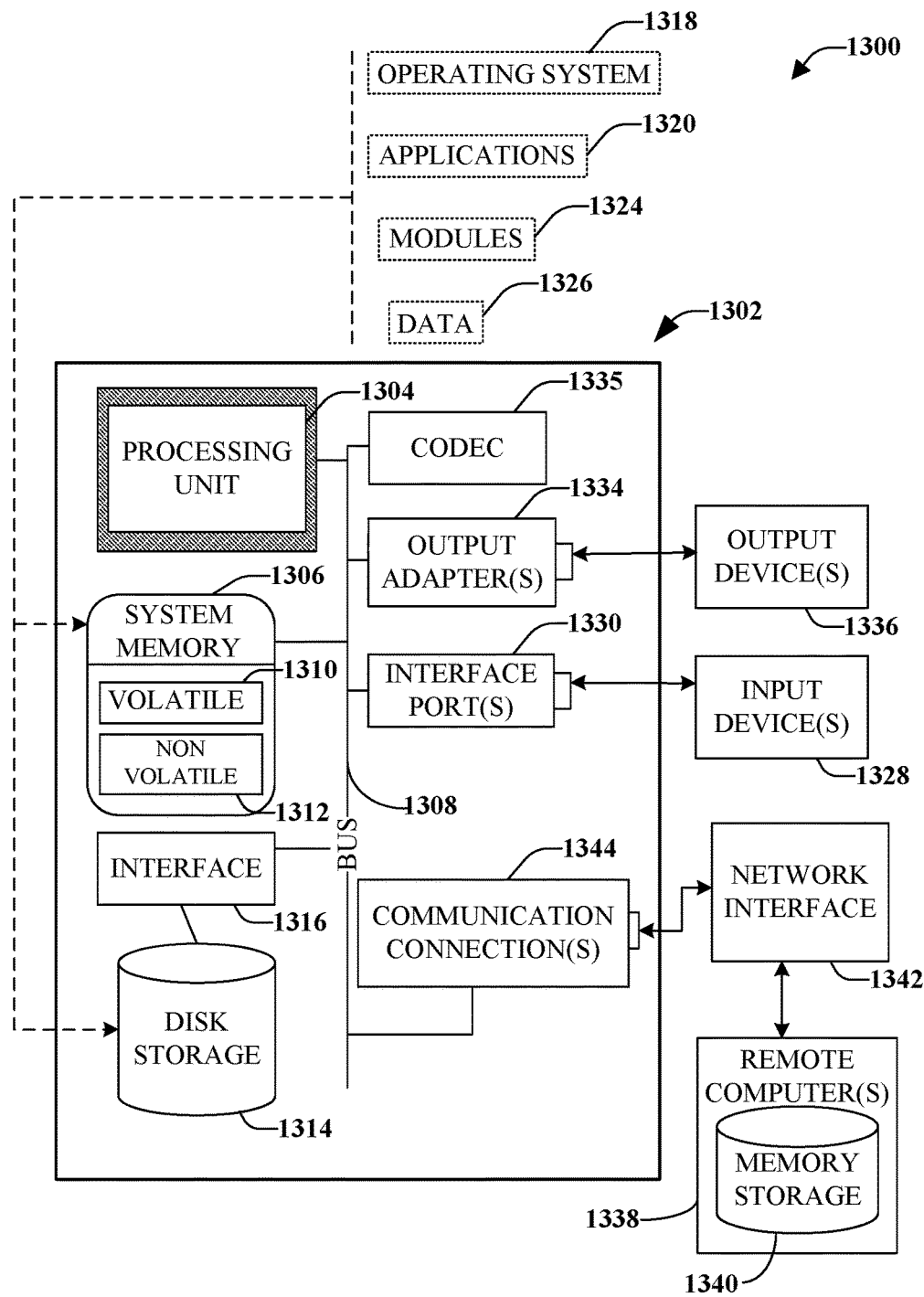
FIG. 13 illustrates a block diagram of an example computing environment that can be implemented in conjunction with various embodiments.

With reference to FIG. 13, a suitable environment 1300 for implementing various aspects of the claimed subject matter includes a computer 1302. The computer 1302 includes a processing unit 1304, a system memory 1306, a codec 1335, and a system bus 1308. The system bus 1308 couples system components including, but not limited to, the system memory 1306 to the processing unit 1304. The processing unit 1304 can be any of various available processors. Dual microprocessors and other multiprocessor architectures also can be employed as the processing unit 1304.

The system bus 1308 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1306 includes volatile memory 1310 and non-volatile memory 1312, which can employ one or more of the disclosed memory architectures, in various embodiments. The basic input/output system (BIOS), containing the basic routines to transfer information between elements within the computer 1302, such as during start-up, is stored in non-volatile memory 1312. In addition, according to present innovations, codec 1335 may include at least one of an encoder or decoder, wherein the at least one of an encoder or decoder may consist of hardware, software, or a combination of hardware and software. Although, codec 1335 is depicted as a separate component, codec 1335 may be contained within non-volatile memory 1312. By way of illustration, and not limitation, non-volatile memory 1312 can include read only memory (ROM), programmable ROM (PROM), electrically programmable ROM (EPROM), electrically erasable programmable ROM (EEPROM), or Flash memory. Non-volatile memory 1312 can employ one or more of the disclosed memory devices, in at least some embodiments. Moreover, non-volatile memory 1312 can be computer memory (e.g., physically integrated with computer 1302 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1310 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1302 may also include removable/non-removable, volatile/non-volatile computer storage medium. FIG. 13 illustrates, for example, disk storage 1314. Disk storage 1314 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1314 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1314 to the system bus 1308, a removable or non-removable interface is typically used, such as interface 1316. It is appreciated that storage devices 1314 can store information related to a user. Such information might be stored at or provided to a server or to an application running on a user device. In one embodiment, the user can be notified (e.g., by way of output device(s) 1336) of the types of information that are stored to disk storage 1314 or transmitted to the server or application. The user can be provided the opportunity to opt-in or opt-out of having such information collected or shared with the server or application by way of input from input device(s) 1328), It is to be appreciated that FIG. 13 describes software that acts as an intermediary between users and the basic computer resources described in the suitable operating environment 1300. Such software includes an operating system 1318. Operating system 1318, which can be stored on disk storage 1314, acts to control and allocate resources of the computer system 1302. Applications 1320 take advantage of the management of resources by operating system 1318 through program modules 1324, and program data 1326, such as the boot/shutdown transaction table and the like, stored either in system memory 1306 or on disk storage 1314. It is to be appreciated that the claimed subject matter can be implemented with various operating systems or combinations of operating systems.

A user enters commands or information into the computer 1302 through input device(s) 1328. Input devices 1328 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1304 through the system bus 1308 via interface port(s) 1330. Interface port(s) 1330 include, for example, a serial port, a parallel port, a game port, and a universal serial bus (USB). Output device(s) 1336 use some of the same type of ports as input device(s) 1328. Thus, for example, a USB port may be used to provide input to computer 1302 and to output information from computer 1302 to an output device 1336. Output adapter 1334 is provided to illustrate that there are some output devices 1336 like monitors, speakers, and printers, among other output devices 1336, which require special adapters. The output adapters 1334 include, by way of illustration and not limitation, video and sound cards that provide a means of connection between the output device 1336 and the system bus 1308. It should be noted that other devices or systems of devices provide both input and output capabilities such as remote computer(s) 1338.

Computer 1302 can operate in a networked environment using logical connections to one or more remote computers, such as remote computer(s) 1338. The remote computer(s) 1338 can be a personal computer, a server, a router, a network PC, a workstation, a microprocessor based appliance, a peer device, a smart phone, a tablet, or other network node, and typically includes many of the elements described relative to computer 1302. For purposes of brevity, only a memory storage device 1340 is illustrated with remote computer(s) 1338. Remote computer(s) 1338 is logically connected to computer 1302 through a network interface 1342 and then connected via communication connection(s) 1344. Network interface 1342 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1344 refers to the hardware/software employed to connect the network interface 1342 to the bus 1308. While communication connection 1344 is shown for illustrative clarity inside computer 1302, it can also be external to computer 1302. The hardware/software necessary for connection to the network interface 1342 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A non-volatile node retainer circuit, comprising:
    an input node connected to an output node of a volatile multi-state device;
    a write activation circuit configured, in response to a write voltage, to write an output signal representing at least one bit of data at the output node of the volatile multi-state device to one non-volatile, two-terminal memory cell, wherein writing the output signal is performed in 50 nanoseconds or less, wherein the one non-volatile, two-terminal memory cell stores the output signal as a stored signal in response to application of the output signal across a first terminal of the one non-volatile, two-terminal memory cell and a second terminal of the one non-volatile, two-terminal memory cell, wherein a logic state of the stored signal is determined from current flow between the first terminal and the second terminal;
    a read activation circuit configured, in response to a read voltage, to output the stored signal from the one non-volatile, two-terminal memory cell to the input node connected to the output node of the volatile multi-state device; and
    power management logic configured to apply the write voltage to the write activation circuit in response to determination of a planned power-down event or an unplanned power-down event associated with the volatile multi-state device.

2. The non-volatile node retainer circuit of claim 1, further comprising a transmission gate between the volatile multi-state device and the output node of the volatile multi-state device, wherein the transmission gate is configured to electrically isolate the volatile multi-state device from the output node in response to the read voltage, and electrically connect the volatile multi-state device to the output node in response to the write voltage.

3. The non-volatile node retainer circuit of claim 1, wherein the power management logic is configured to apply the read voltage to the read activation circuit in response to termination of the planned power-down event.

4. The non-volatile node retainer circuit of claim 1, further comprising a power monitoring circuit configured to determine existence of the unplanned power-down event in response to satisfaction of a criterion.

5. The non-volatile node retainer circuit of claim 4, wherein the criterion includes a power supply voltage falling below a threshold power value, or the power supply voltage falling below the threshold power value for a second threshold duration.

6. The non-volatile node retainer circuit of claim 1, wherein the volatile multi-state device is selected from a first group consisting of: a data flip flop, a latch, a switch, and a register.

7. The non-volatile node retainer circuit of claim 1, wherein the one non-volatile, two-terminal memory cell is selected from a second group consisting of: an organic RAM, a resistive RAM, a phase change RAM, and a conductive bridging RAM.

8. The non-volatile node retainer circuit of claim 7, wherein the one non-volatile, two-terminal memory cell is a resistive RAM that comprises:
    a top electrode as the first terminal;

a resistive switching material that stores the stored signal; and a bottom electrode as the second terminal, wherein at least one of the top electrode or bottom electrode comprises a material that provides mobile ions to form a conductive path through the resistive switching material in response to the output signal providing a suitable stimulus across the top electrode and the bottom electrode of the resistive RAM.

9. The non-volatile node retainer circuit of claim 8, wherein the suitable stimulus is selected from a third group consisting of: an electric field, a joule heat, and a magnetic field.

10. The non-volatile node retainer circuit of claim 9, wherein the material is selected from a fourth group consisting of a noble metal and an alloy or compound containing a noble metal.

11. The non-volatile node retainer circuit of claim 1, wherein writing the output signal is performed in 20 nanoseconds or less.

12. The non-volatile node retainer circuit of claim 1, further comprising: a plurality of transistors between the input node and the one non-volatile, two-terminal memory cell, wherein the plurality of transistors are configured to electrically isolate the one non-volatile, two-terminal memory cell from the output signal in absence of the write voltage, and electrically connect the non-volatile, two-terminal memory cell to the output signal in response to the write voltage.

13. The non-volatile node retainer circuit of claim 1, wherein the read activation circuit is configured to output the stored signal from the one non-volatile, two-terminal memory cell in 50 nanoseconds or less.

14. The non-volatile node retainer circuit of claim 1, wherein the read activation circuit is configured to output the stored signal to the volatile multi-state device.

15. The non-volatile node retainer circuit of claim 1, wherein the read activation circuit is configured to output the stored signal to a second volatile multi-state device.

16. The non-volatile node retainer circuit of claim 15, wherein the volatile multi-state device is a first data flip flop and the second volatile multi-state device is a second data flip flop.

17. The non-volatile node retainer circuit of claim 15, wherein the volatile multi-state device is a first latch and the second volatile multi-state device is a second latch.

18. The non-volatile node retainer circuit of claim 6, wherein the read activation circuit is configured to output the stored signal to a second volatile multi-state device selected from a second group consisting of a second data flip and a second latch.

* * * * *